United States Patent
Yan et al.

(10) Patent No.: US 8,903,344 B2
(45) Date of Patent: *Dec. 2, 2014

(54) PROGRAMMABLE ATTENUATOR

(75) Inventors: Hongyan Yan, San Diego, CA (US); Bhushan Shanti Asuri, San Diego, CA (US); Vinod V Panikkath, San Diego, CA (US); Janakiram G Sankaranarayanan, San Diego, CA (US); Himanshu Khatri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 225 days.

This patent is subject to a terminal disclaimer.

(21) Appl. No.: 12/957,247

(22) Filed: Nov. 30, 2010

(65) Prior Publication Data

US 2012/0135698 A1 May 31, 2012

(51) Int. Cl.
*H04B 1/06* (2006.01)
*H03H 7/24* (2006.01)

(52) U.S. Cl.
CPC ........................... *H03H 7/24* (2013.01)
USPC ................ 455/249.1; 455/67.11; 455/114.2; 455/423

(58) Field of Classification Search
CPC ... H03F 1/223; H03F 3/195; H03F 2200/294; H03F 2200/372; H03F 3/191; H03F 2200/78; H03F 1/0205; H03F 1/26; H03F 1/3294; H03F 2200/111; H03F 2200/225; H03F 2200/331; H03F 2200/366; H03F 2200/391; H03F 2200/04
USPC ........................................................ 455/249.1
See application file for complete search history.

(56) References Cited

U.S. PATENT DOCUMENTS

| | | | | |
|---|---|---|---|---|
| 4,456,886 A | * | 6/1984 | Nishioka et al. | 330/254 |
| 4,942,375 A | * | 7/1990 | Petitjean et al. | 333/81 R |
| 5,507,017 A | * | 4/1996 | Whitmarsh et al. | 455/126 |
| 5,793,817 A | * | 8/1998 | Wilson | 375/297 |
| 6,489,856 B1 | | 12/2002 | Weigand | |
| 7,129,871 B1 | * | 10/2006 | Venes et al. | 341/136 |
| 7,205,817 B1 | | 4/2007 | Huang et al. | |
| 7,672,669 B2 | * | 3/2010 | Alexander et al. | 455/423 |
| 2008/0020746 A1 | * | 1/2008 | Alexandar et al. | 455/423 |
| 2008/0100404 A1 | * | 5/2008 | Vice | 333/81 A |
| 2010/0130144 A1 | * | 5/2010 | Narathong et al. | 455/114.2 |
| 2012/0045992 A1 | * | 2/2012 | Kwon | 455/41.2 |
| 2012/0045997 A1 | * | 2/2012 | Wang | 455/67.11 |
| 2012/0121106 A1 | * | 5/2012 | Henriksen | 381/94.1 |

FOREIGN PATENT DOCUMENTS

| EP | 0474337 A1 | 3/1992 |
|---|---|---|
| EP | 647024 A1 | 4/1995 |

OTHER PUBLICATIONS

International Search Report and Written Opinion—PCT/US2011/062727—ISA/EPO—Apr. 12, 2012.

* cited by examiner

*Primary Examiner* — Ajibola Akinyemi
(74) *Attorney, Agent, or Firm* — Linda G. Gunderson

(57) ABSTRACT

Disclosed are circuits, techniques and methods for implementing an attenuator in a signal transmission path. In one particular implementation, an attenuation may be adjusted based, at least in part, on a control signal. In another implementation, such an attenuation may be adjusted in coarse increments by varying one or more gate voltages applied one or more transistors. In yet another implementation, adjusting said attenuation in fine increments by varying a bias voltage applied to at least one level shifter.

17 Claims, 4 Drawing Sheets

PROGRAMMABLE ATTENUATOR

BACKGROUND

Transmitter circuitry in mobile communication devices, such as mobile phones, typically includes upconversion circuitry to, for example, shift the frequency of a baseband signal to a radio frequency for transmission. In a typical transmitter architecture, an upconverted signal is amplified by a driver amplifier (DA) within a radio frequency integrated chip (RFIC) device. The amplified signal may then filtered by an off-chip bandpass filter (BPF), which is, typically, implemented as surface acoustical wave (SAW) filter, or a film bulk acoustic wave (FBAR) filter due to their low insertion losses and high quality factors. These filters typically convert electrical signals to a mechanical wave in a device constructed of a piezoelectric crystal or ceramic. This mechanical wave may then be delayed as it propagates across the device, before being converted back to an electrical signal for transmission through an antenna. Here, such a BPF may be tailored to reduce receiver band noise. However, as integration of a piezoelectric with an RFIC may have practical limitations, such a BPF is typically implemented as an off-chip component, which increases costs and bill of materials (BOM), and occupies significant board area. Hence, there has been a trend to remove an off-chip BPF (e.g., a SAW filter) from the transmission path between an RFIC device and a power amplifier (PA), especially in a multi-band transmitter.

In a particular application, a transmitter may be implemented in a mobile device (e.g., mobile phone for communication with a base station). Here, such a mobile device may transmit maximum power in a narrow range of output power. An upper end of this range may be limited by user safety (e.g., to avoid excessive exposure to RF radiation). A lower end of this range may be set according to data rate/throughput requirements. A transmitter typically includes an RFIC device and a power amplifier. A power amplifier gain may vary from one particular manufactured device to another. Gain variation may also arise from other factors including changes in the frequency at which the mobile device operates and changes in the temperature of the mobile device. In response to a change in power amplifier gain, a mobile device may increase or decrease output power from an RFIC device so that a maximum output power from the mobile device is restricted to a desired range. Typically, a level of noise relative to output power of an RFIC device degrades by 0.5 dB for every 1.0 dB decrement in power. Since the power from an RFIC device and gain of the power amplifier may be adjusted to ensure that the output power is within a target range, degradation in a relative level of noise at the RFIC may result for an equivalent degradation in an absolute level of noise at the mobile device output. Such a degradation (increase) in noise at a mobile device transmitter output may lead to increased noise leaking into a receiver through a duplexer. Such noise leaking through the duplexer may degrade the performance of the mobile device receiver. Hence, a BPF is typically implemented to reduce RxBN. The problem is compounded in GSM networks where the requirements of the relative level of noise at the mobile device output are very stringent. Absolute noise requirements may be more or less the same as in CDMA1x or WCDMA networks. However, since the output power is higher, the required relative level of noise may be more difficult to achieve. A typical GSM mobile device may employ a saturating power amplifier with limited gain variation. Newer GSM mobile devices may employ a "small signal polar" design that usually is accompanied with much larger power amplifier gain variation. The two factors—increasing gain variation in power amplifier and more difficult relative noise requirements lead mobile device manufacturers to artificially boost an output power of an RFIC device first. Relative noise from an RFIC device may be improved at these boosted powers. The power may then be attenuated by an external attenuator to ensure that the power amplifier is not over-driven. Such an external attenuator may enable a reduction in power without impacting a relative level of noise. It should be noted that in GSM networks noise in a receive band may not desensitize a mobile device receiver because this kind of transmitter only has either the transmit or receive path operational at a given time instant. Instead, the noise from the transmitter of a first mobile device may desensitize the receiver of a second mobile device which may be in close physical proximity to the first device.

SUMMARY

One particular implementation is directed to a circuit to receive a signal upconverted to a radio frequency for transmission in a transmission medium and an attenuator to apply an attenuation to the received signal responsive to a control signal. It should be understood, however, that this is merely an example implementation, and that claimed subject matter is not limited in this respect.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments and is not intended to represent the only embodiments covered by claimed subject matter. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments. It will be apparent to those skilled in the art that exemplary embodiments of may be practiced without these specific details. In some instances, well known structures and devices are shown in block diagram form in order to avoid obscuring the novelty of exemplary embodiments presented herein.

As pointed out above, insertion of an attenuation circuit between a driver amplifier (DA) and power amplifier may enable removal of a SAW filter. In one exemplary implementation, an attenuator may assist in maintaining acceptable noise performance even as output power is reduced. In a particular implementation, an on-chip variable resistive attenuator may replace an off-chip bandpass filter (BPF). Here, use of such an attenuator may enable reduction in RFIC output power by increasing RF attenuation instead of increasing a gain of previous stages. In particular implementations, this may achieve a 0.15 dB degradation in RxBN with every 1.0 dB reduction in RFIC output power. Hence, a desired RxBN may be achieved without using a SAW filter, which typically introduces a 2.0-3.0 dB insertion loss to be compensated by the RFIC. Hence, elimination of a SAW filter may reduce power consumption.

In one particular implementation, a variable attenuator may be constructed as a passive attenuator from a resistive voltage divider, such as an adjustable voltage divider. For example, such an attenuator may vary an attenuation of a signal in a transmission path in response to or according to an out-of-band control signal.

Figure 1:
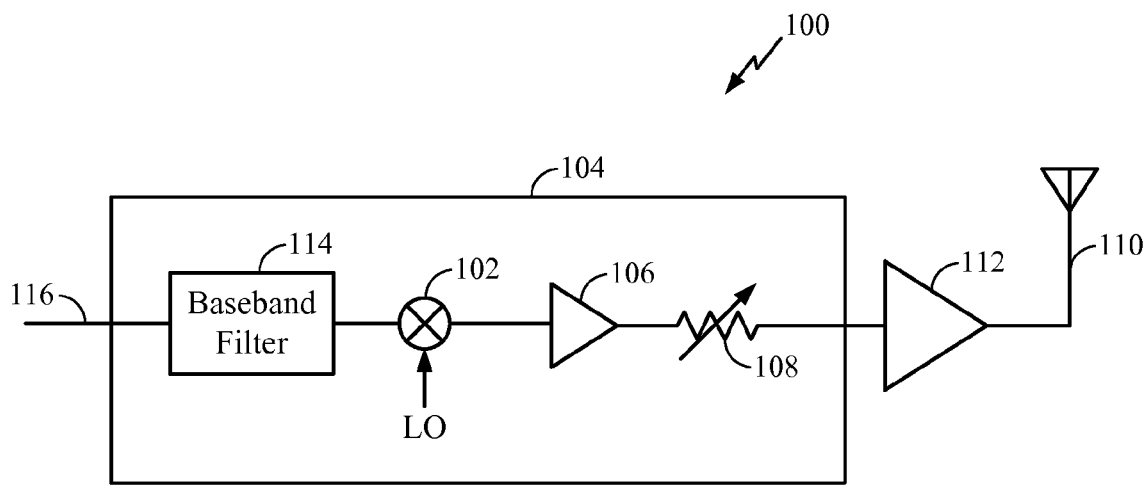
FIG. 1 is a schematic diagram of a circuit for transmitting radio frequency (RF) signals.

FIG. 1 is a schematic diagram of a circuit 100 for transmitting radio frequency (RF) signals according to an exemplary implementation. Circuit 100 may be implemented in any device for transmission over a wireless air interface including devices capable of transmitting information over a wireless communication network, for example. Here, a basedband signal 116 may be modulated with information such as, for example, digitized and/or encoded data and/or media content for transmission to a destination using, for example, a wireless communication network. Baseband filter 114 may isolate particular portions of basedband signal 116 to be transmitted, which may be at a predetermined frequency band about an intermediate and/or baseband frequency. The isolated portions may then be upconverted to a radio frequency (RF) for transmission through antenna 110 by mixing the isolated portions with a local oscillator (LO) at mixer 102. In the particular implementation of FIG. 1, a driver amplifier (DA) 106 and attenuator 108 are disposed within a single RF integrated circuit (RFIC) 104. In other implementations, however, such DA 106 and attenuator 108 need not be integrated within the same integrated circuit. Power amplifier (PA) 112 is coupled as a load to an output terminal of RFIC 104. As pointed out above, an attenuation applied by attenuator 108 may be varied or controlled responsive to an out-of-band control signal. In a particular implementation, RFIC 104 may comprise a bus interface (not shown) that may be coupled to a bus (not shown) for receiving digital out-of-band control signals from a processor such as an application processor or modem processor (not shown) in a communication device. Such a processor may generate such digital out-of-band control signals by executing machine-readable instructions stored on a storage medium. Here, such digital out-of-band control signals may be generated to affect an attenuation applied to adjust a gain and/or account for variations in semiconductor processing or temperature, just to name a couple of examples. In this context, a "storage medium" may comprise physical and non-transitory article in the form of a computer or processor accessible storage device. In particular non limiting examples, such a storage medium may comprise a magnetic, semiconductor, optical or other medium capable of storing information such as data or machine-readable instructions for processing such data.

Figure 2:
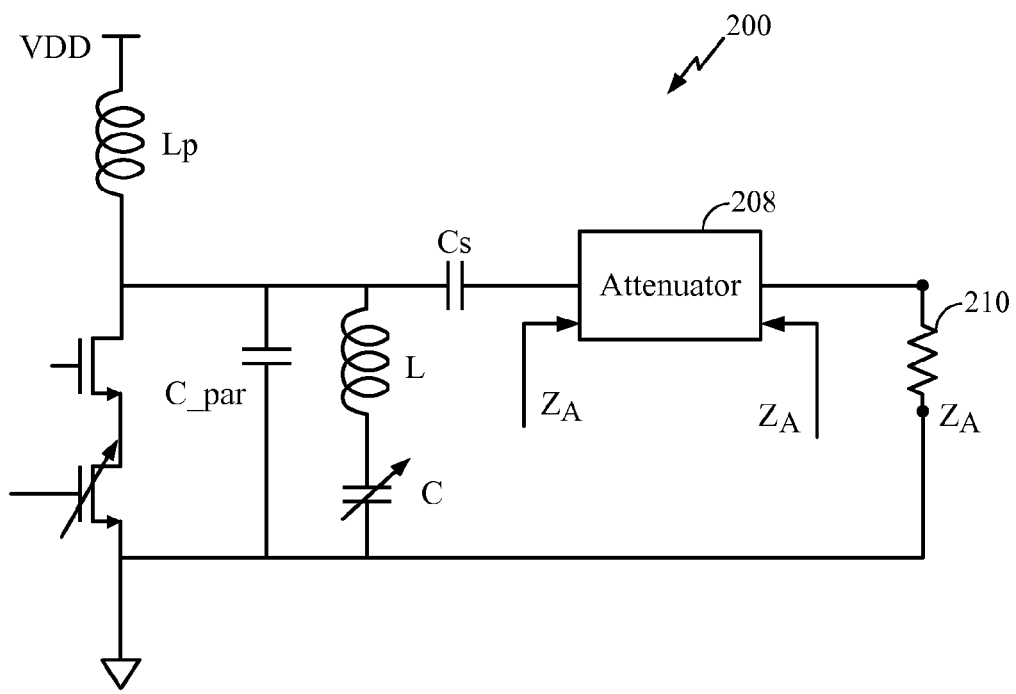
FIG. 2 is a schematic diagram of a circuit for an implementation of an attenuator in combination with a driver amplifier on an integrated device according to an implementation.

FIG. 2 is a schematic diagram of a circuit for an implementation of an attenuator 208 in combination with a driver amplifier on an integrated device according to an exemplary implementation. Such an implementation of an attenuator 208 may be implemented in RFIC 104 described above. However, claimed subject matter is not limited in this respect. In the particular example of FIG. 2, attenuator 208 is connected to a driver amplifier at an output capacitor Cs. A load 210 (e.g., at an input terminal of a power amplifier) is shown as having an impedance of $Z_A$. In a particular example, $Z_A$ may be about 50.0 ohms. However, $Z_A$ may impart a larger or smaller impedance without deviating from claimed subject matter. As shown in FIG. 2, attenuator 208 may have an input and output impedance that substantially matches that of load 210. As such, insertion of attenuator 208 does not affect matching the impedance of load 210 to the output impedance of the driver amplifier. By matching an input impedance at an output terminal of a driver amplifier with an output impedance connected to load 210, insertion of attenuator 208 does not degrade any matching of an impedance with load 210.

Figure 3:
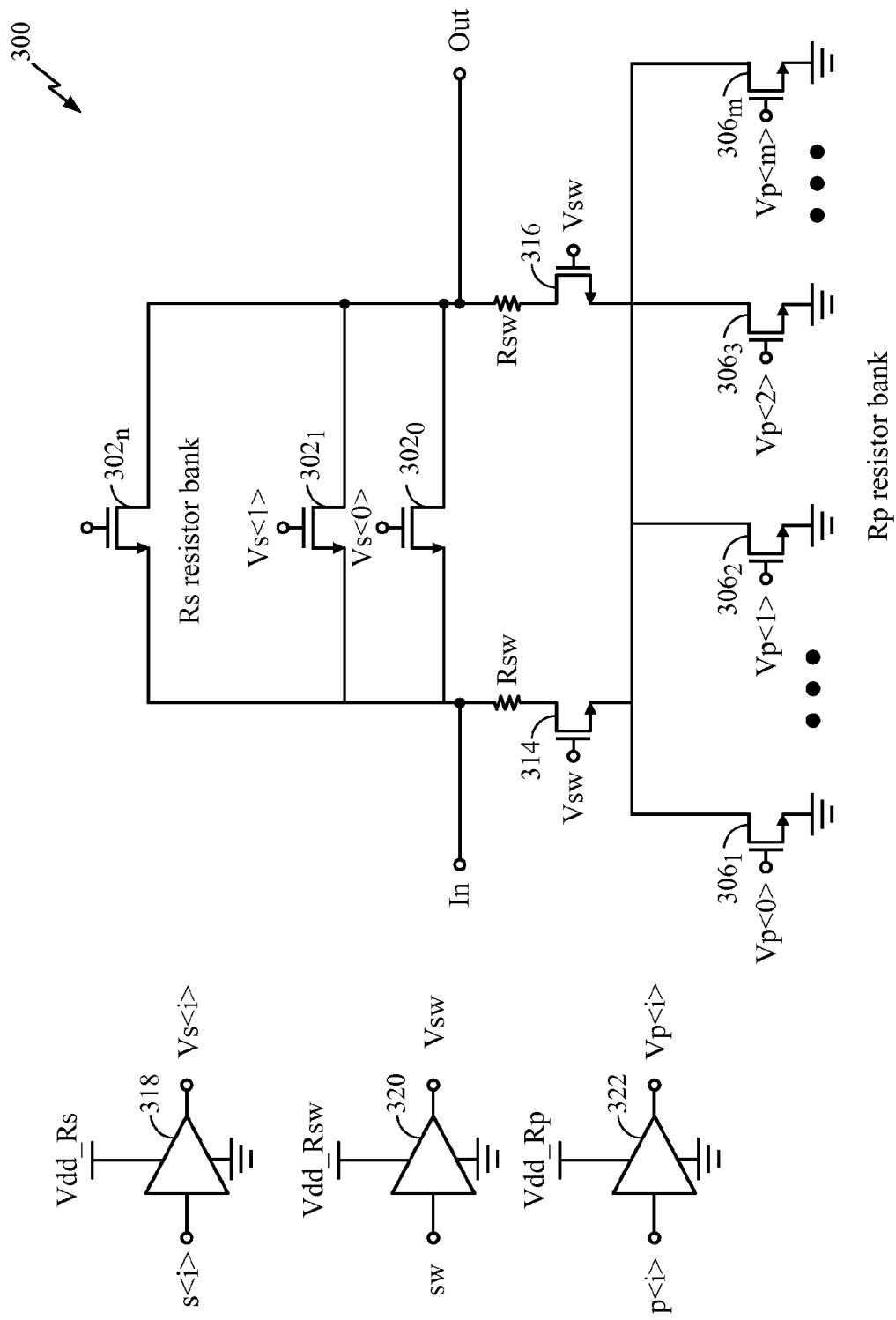
FIG. 3 is a schematic diagram of a circuit for a digitally programmable attenuator according to an implementation.

FIG. 3 is a schematic diagram of a circuit for a programmable attenuator according to an implementation. Such an implementation of a resistive attenuator having a series resistance and a shunt resistance may be implemented in attenuator 208 described above. However, claimed subject matter is not limited in this respect. Here a resistor bank Rs forms a series resistance while resistor bank RP provides a shunt resistance. In this particular implementation resistor bank Rs, formed by NMOS transistors 302, and resistor bank Rp, formed by NMOS transistors 306, are controlled by control signals s<i>, sw and p<i> to vary an attenuation between input terminal In and output terminal Out. Control signals s<i>, sw and p<i> are applied to level shifters 318, 320 and 322 to provide voltages Vs<i>, Vsw and Vp<i>. Voltages Vs<i> are applied to corresponding gates of NMOS transistors 302 to vary a conductivity or resistance between terminals In and Out to control or affect an attenuation there between. Similarly, voltages Vp<i> are applied to corresponding gates of NMOS transistors 306 to vary a conductivity or resistance to ground to thereby control or affect an attenuation applied between terminals In and Out. Attenuator 300 may be disabled by setting sw to a voltage equivalent to a logical "0," providing a gate voltage Vsw of 0.0 volts to gates of NMOS transistors 314 and 316, and setting s<i> to a voltage equivalent to a logical "1" for all i, providing high gate voltages to gates of NMOS transistors 302. Here, application of 0.0 volts to gates of NMOS transistors 314 and 316 may remove resistor bank Rp and application of high voltages to gates of transistors 302 may apply a short between terminals In and Out.

In a particular implementation, control signals s<i>, sw and p<i> may be generated from one or more corresponding digital control signals (e.g., out of band digital control signals received from a bus interface). Here, such digital control signals may be applied to one or more digital to analog (D/A) converters (not shown) to generate control signals as corresponding voltage signals. It should be understood, however, that this is merely an example of how out of band digital control signals may be processed for affecting a degree of attenuation applied to RF signals in a transmission path, and claimed subject matter is not limited in this respect.

Figure 4:
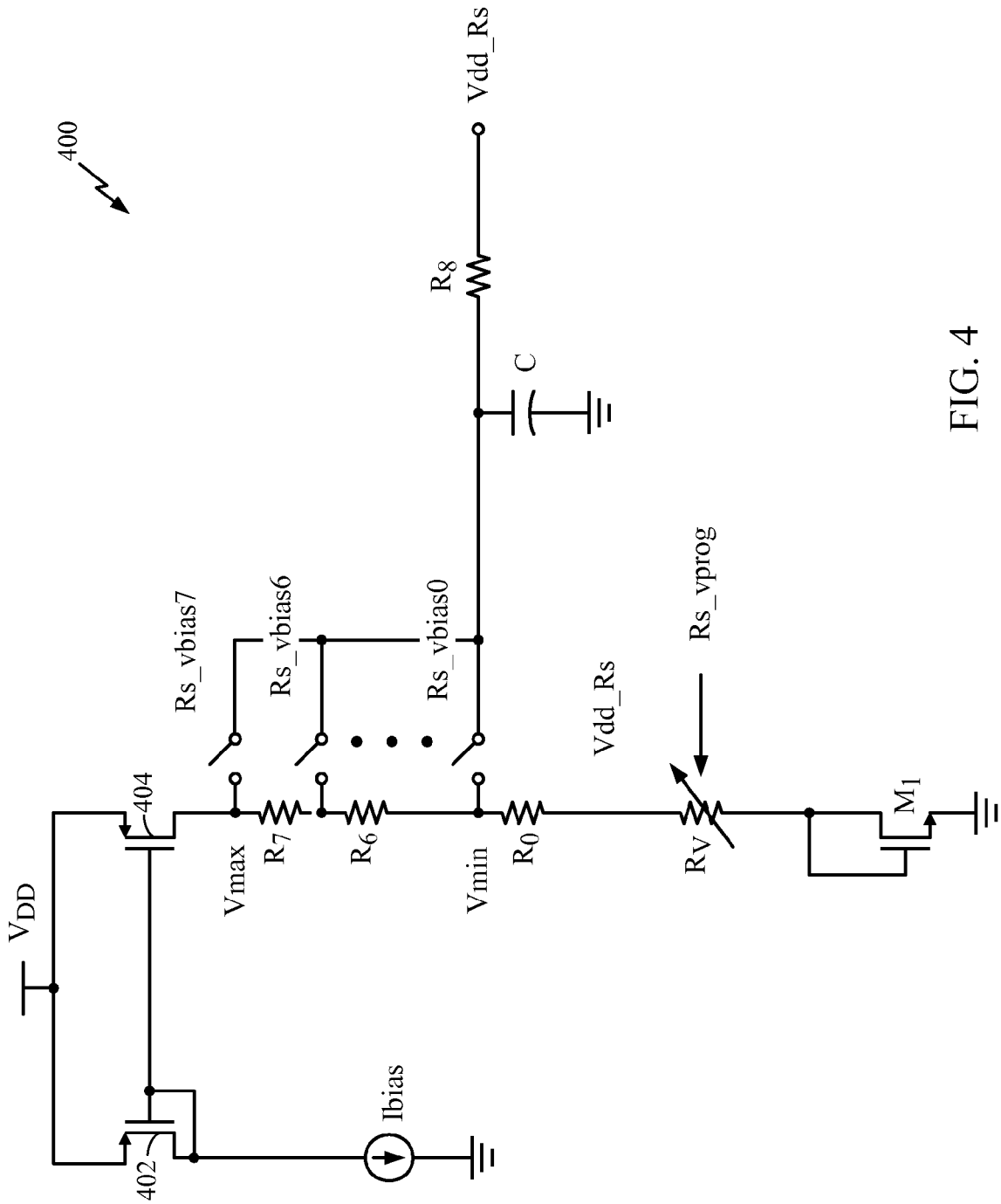
FIG. 4 is a schematic diagram of a circuit for an attenuator that is digitally programmable for coarse and fine adjustments to attenuation according to an implementation.

Attenuation circuit 300 discussed above may enable controlling attenuation of signals in a transmission path by coarse increments according to digital signals s<i> and p<i>. In one implementation, a degree of attenuation applied by circuit 300 may be controlled with finer granularity by varying/controlling bias voltages Vdd_Rs, Vdd_Rsw and Vdd_Rp applied to level shifters 318, 320 and 322. In a particular implementation of circuit 400 as shown in the schematic diagram of FIG. 4, bias voltage Vdd_Rs may be controlled/ varied in response to a digital control signal in order to control attenuation of circuit 300 with finer granularity. Here, variations to bias voltage Vdd_Rs may affect the magnitude of signals Vs<i>, which may then affect a series resistance provided by resistor bank Rs as discussed above. As shown in FIG. 4, diode-coupled transistor 402 and transistor 404 form a PFET bias current mirror to control a current passing through resistors $R_0$ through $R_7$ and variable resistor Rs_vprog forming a current ladder. An output bias voltage Vdd_Rs may be varied by selectively shorting resistors in the current ladder in response to signals Rs_vbias. Output bias voltage Vdd_Rs may also be varied by varying a resistance of resistor Rs_vprog.

In one implementation, Rs_vbias0 through Rs_vbias7 may be generated from a three-bit digital control signal (e.g., as part of an out-of-band digital control signal received at a bus interface) for fine attenuation control. Affecting the resistance in the current ladder formed by resistors $R_0$ through $R_7$ may allow for control of voltage Vdd_Rs in fine increments (and therefore control an attenuation applied to a signal in an RF transmission path as discussed above). Here, as resistance in the current ladder is increased, voltage Vdd_Rs may increase.

In the particular example illustrated in FIG. 4, diode coupled transistor M1 may compensate for process variations in switch transistors used to implement switches controlled by Rs_vbias0 through Rs_vbias7. Additionally, current Ibias may be adjusted to compensate for temperature variations. In a particular implementation, Ibias may be implemented as a bandgap current source. Also, capacitor C and resistor $R_8$ may form an RC filter to prevent RF signals in a transmission path from leaking back into biasing circuit 400.

Figure 5:
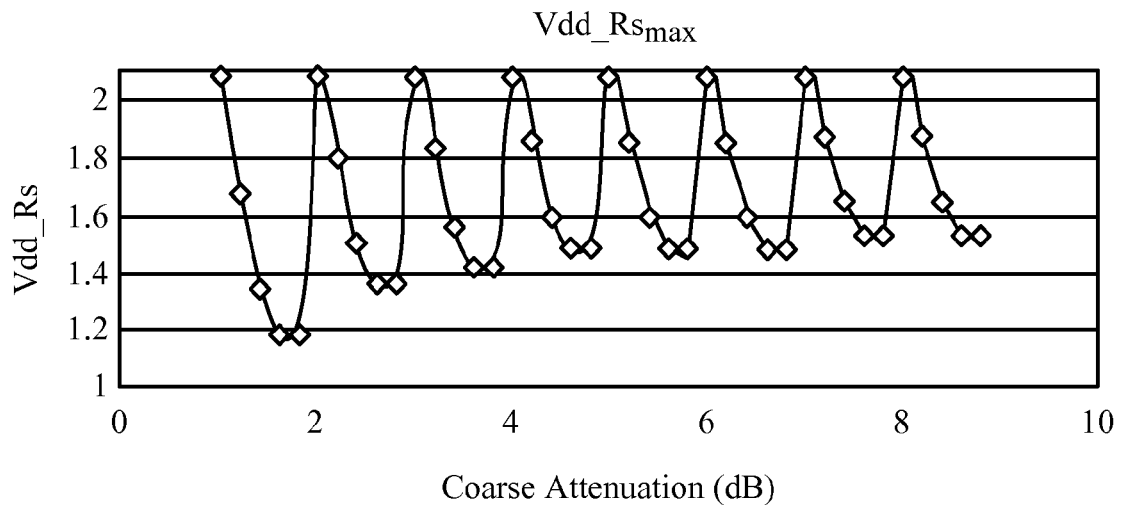
FIG. 5 is a plot describing an output voltage based on combinations of fine and coarse adjustments applied to an attenuation circuit according an implementation.

FIG. 5 is a plot representing characteristics of an output bias voltage Vdd_Rs affected by combinations of fine and coarse adjustments to attenuation applied to signals in a transmission path according an exemplary implementation. An attenuation resulting from an attenuator is shown along a horizontal access in dB, while increments of fine adjustment to attenuation applied through setting bias voltage Vdd_Rs up to a voltage $Vdd\_Rs_{max}$. Here, peaks in the resulting plot may represent changes in attenuation in discrete coarse increments by programming attenuator circuit 300 with discrete digital values for s<i>, sw and p<i> as discussed above with bias voltage Vdd_Rs being set to a maximum bias voltage $Vdd\_Rs_{max}$. Points on the plot between peaks may represent fine incremental adjustments in attenuation from incremental decreases in Vdd_Rs from $Vdd\_Rs_{max}$. It should be observed that as a coarse attenuation increases, a range and step size of Vdd_Rs for applying a uniform fine attenuation step reduces. For instance, for coarse attenuation of 1.0 dB, the Vdd_Rs range may be from 2.1 V to 1.18 V, while for a coarse attenuation of 8.0 dB, the Vdd_Rs range may be from 2.1 V to 1.55 V. Thus, in a particular implementation, a range and step size of Vdd_Rs may change according to a coarse attenuation step so that a given fine attenuation control result in the same corresponding fine attenuation step, irrespective of the coarse attenuation settings. This may be achieved by adjusting the variable resistor Rs_vprog to affect variable resistance Rv as discussed above in connection with FIG. 4.

Figure 6:
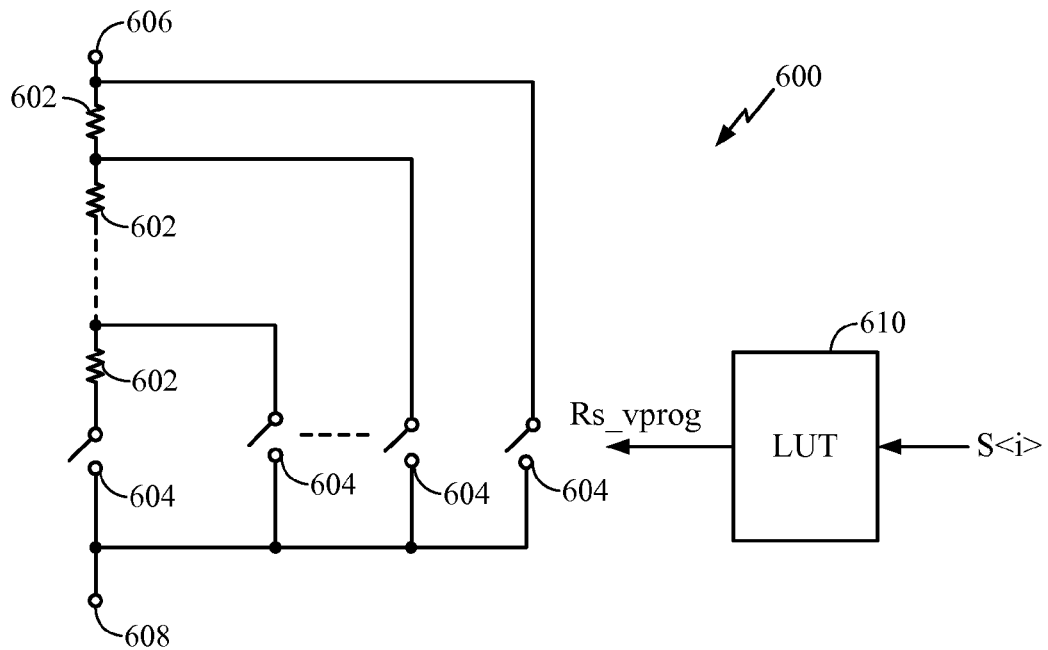
FIG. 6 is a schematic diagram of a circuit for applying a variable resistance based upon a digital control signal according to an implementation.

FIG. 6 is a schematic diagram of a circuit for changing a resistance applied by variable resistance Rv according to a particular implementation of circuit 400 to vary a resulting attenuation of an attenuator circuit in fine increments. Here, resistors 602 are coupled in series between terminals 606 and 608 such that a resulting resistance for variable resistor Rv is determined between terminals 606 and 608. In a particular implementation, digital control signal Rs_vprog is obtained from a look up table (LUT) 610 and may selectively close switches 604 to short one or more resistors 602 between terminals 606 and 608 to thereby decrease the variable resistance Rv. In the presently illustrated implementation, digital control signal Rs_vprog is obtained from LUT 610 based on digital signal s<i>, which may also be used for applying a coarse adjustment to attenuation at circuit 300 by controlling gate voltages Vs<i> of NMOS transistors 302 of resistor bank Rs described above. In an alternative implementation, however, LUT 610 may be replaced by hardwired logic to generate digital control signal Rs_vprog for selectively opening or closing switches 604. The particular implementations of FIGS. 4 through 6 are directed to varying bias voltage Vdd_Rs to impart fine incremental changes in attenuation between terminals In and Out in FIG. 3 by affecting a resistance of resistor bank Rs. It can be seen that such features in FIGS. 4 through 6 may be similarly applied in varying bias voltages Vdd_Rsw and Vdd_Rp to vary resistances applied to gates of NMOS transistors 314 and NMOS transistors to similarly impart incremental changes to an attenuation between terminals In and Out. Additionally, bias voltages Vdd_Rs, Vdd_Rsw and Vdd_Rp may be programmable varied using techniques described herein to account for process or temperature variations.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may comprise machine-readable instructions residing in a storage medium such as, for example, Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method comprising:
    amplifying a radio frequency (RF) signal by a driver amplifier (DA) disposed within a radio frequency integrated circuit (RFIC);
    attenuating the amplified RF signal by an attenuator disposed within the RFIC;
    varying an attenuation responsive to a control signal;
    applying the control signal to one or more level shifters to provide one or more gate voltages for one or more transistors of the attenuator; and
    adjusting said attenuation in a coarse adjustment by changing the control signal to vary said gate voltages, wherein said gate voltages control a resistance between an input terminal and an output terminal of the attenuator to vary said attenuation.

2. The method of claim 1, and further comprising executing machine readable instructions by a processor to generate said control signal as a digital signal.

3. The method of claim 1, and further comprising further adjusting said attenuation in a fine adjustment by varying a bias voltage applied to said level shifters to vary said gate voltages.

4. The method of claim 3, and further comprising varying said bias voltage by varying a variable resistance.

5. The method of claim 3, wherein for a same amount of the fine adjustment a variation in the bias voltage has a reduced step size corresponding to an increase in said attenuation by the coarse adjustment.

6. The method of claim 1, wherein said one or more transistors form a series resistance.

7. The method of claim 1, wherein said one or more transistors form a shunt resistance.

8. The method of claim 1, the method further comprising receiving said control signal as an out-of-band digital control signal at a bus interface of the RFIC.

9. An article comprising:
    a storage medium comprising machine-readable instructions stored there on which are executable by processor to generate a control signal to vary an attenuation, effectuated by an attenuator disposed within a radio frequency integrated circuit (RFIC), and applied to a radio frequency signal amplified by a driver amplifier (DA) disposed within the RFIC, wherein said machine-readable instructions are further executable by said processor to generate said control signal so as to vary said attenuation in a coarse adjustment by changing the control signal to vary one or more gate voltages for one or more transistors of the attenuator, wherein said gate voltages, provided by applying the control signal to one or more level shifters, control a resistance between an input terminal and an output terminal of the attenuator to vary said attenuation.

10. The article of claim 9, wherein said machine-readable instructions are further executable by said processor to generate said control signal so as to vary said attenuation in a fine adjustment by varying a bias voltage of applied to said level shifters.

11. A circuit comprising:
    a driver amplifier (DA) disposed within a radio frequency integrated circuit (RFIC) configured to amplify a radio frequency (RF) signal; and
    a variable attenuator disposed within the RFIC in communication with the DA, the attenuator configured to attenuate the amplified RF signal, wherein an attenuation is varied responsive to a control signal, and wherein said attenuator further comprises one or more level shifters to, in response to said control signal, apply one or more gate voltages to transistors forming a resistance coupled between the input terminal and a load to vary said attenuation in a coarse adjustment.

12. The circuit of claim 11, wherein said circuit further comprises a bus interface to receive said control signal from a processor as an out-of-band digital control signal.

13. The circuit of claim 11, wherein said attenuator further comprises circuitry to vary a bias voltage applied to at least one of said one or more level shifters to vary said attenuation in a fine adjustment.

14. The circuit of claim 11, wherein said resistance comprises at least a series resistance.

15. The circuit of claim 11, wherein said resistance comprises at least a shunt resistance.

16. The circuit of claim 11, and further comprising:
a mixer, disposed within the RFIC, configured to mix a baseband signal with a local oscillator to generate said RF signal;
a power amplifier (PA) separate from the RFIC and in communication within an output of the RFIC and configured to amplify the attenuated RF signal, wherein the attenuated RF signal is not an acoustic-wave filtered signal; and
wherein the RFIC and the PA are part of a transmitter circuitry in a mobile device.

17. An apparatus comprising:
means, in a radio frequency integrated circuit (RFIC), for amplifying a radio frequency (RF) signal;
means, in the RFIC, for attenuating the amplified RF signal;
means for varying an attenuation responsive to a control signal;
means for applying the control signal to one or more level shifters to provide one or more gate voltages for the means for attenuating; and
means for adjusting said attenuation in a coarse adjustment by changing the control signal to vary said gate voltages, wherein said gate voltages control a resistance between an input terminal and an output terminal of the means for attenuating to vary said attenuation.

\* \* \* \* \*